US012160987B2

(12) United States Patent
Chen et al.

(10) Patent No.: US 12,160,987 B2
(45) Date of Patent: Dec. 3, 2024

(54) METHOD FOR FABRICATING MEMORY AND MEMORY

(71) Applicant: CHANGXIN MEMORY TECHNOLOGIES, INC., Hefei (CN)

(72) Inventors: Longyang Chen, Hefei (CN); Zhongming Liu, Hefei (CN); Yexiao Yu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 652 days.

(21) Appl. No.: 17/460,272

(22) Filed: Aug. 29, 2021

(65) Prior Publication Data
US 2022/0336467 A1  Oct. 20, 2022

Related U.S. Application Data

(63) Continuation of application No. PCT/CN2021/107453, filed on Jul. 20, 2021.

(30) Foreign Application Priority Data

Apr. 15, 2021 (CN) .......................... 202110408047.1

(51) Int. Cl.
*H10B 12/00* (2023.01)
(52) U.S. Cl.
CPC ................... *H10B 12/482* (2023.02)
(58) Field of Classification Search
CPC . H10B 12/482; H10B 12/0335; H10B 12/315
See application file for complete search history.

(56) References Cited

U.S. PATENT DOCUMENTS

| 6,713,341 B2 * | 3/2004 | Chen ................. H01L 29/66181 |
| | | 257/E21.396 |
| 6,716,757 B2 * | 4/2004 | Lin ................... H01L 29/66181 |
| | | 438/386 |

(Continued)

FOREIGN PATENT DOCUMENTS

| CN | 101335231 A | 12/2008 |
| CN | 102217046 B | 4/2015 |

(Continued)

*Primary Examiner* — Kyoung Lee
*Assistant Examiner* — Sophia W Kao
(74) *Attorney, Agent, or Firm* — Kilpatrick Townsend & Stockton LLP

(57) ABSTRACT

Embodiments provide a method for fabricating a memory and a memory. This method includes: providing a substrate, the substrate being internally provided with a plurality of active areas, and each of the plurality of active areas including a first contact region and a second contact region; forming a plurality of bit lines on the substrate, each of the plurality of bit lines being connected to at least one of the first contact regions; forming an isolation layer on each of the plurality of bit lines, the isolation layer covering each of the plurality of bit lines and the substrate, the isolation layer being further provided with a plurality of filling holes corresponding to the plurality of second contact regions one to one; etching the isolation layer and the substrate along the plurality of filling holes, to fill in the plurality of second contact regions.

15 Claims, 11 Drawing Sheets

(56) References Cited

U.S. PATENT DOCUMENTS

| | | | | |
|---|---|---|---|---|
| 6,815,356 B2* | 11/2004 | Tsai | ............... | H01L 21/76232 |
| | | | | 257/E21.549 |
| 8,202,795 B2* | 6/2012 | Lee | ............... | H10B 12/34 |
| | | | | 438/607 |
| 9,685,535 B1* | 6/2017 | Cheng | ............... | H01L 21/84 |
| 11,217,679 B2* | 1/2022 | Lin | ............... | H01L 29/785 |
| 2006/0003530 A1 | 1/2006 | Kim et al. | | |
| 2006/0265098 A1* | 11/2006 | Gould | ............... | G05B 19/40938 |
| | | | | 700/121 |
| 2009/0246949 A1* | 10/2009 | Kim | ............... | H10B 41/30 |
| | | | | 257/E21.209 |
| 2014/0183633 A1* | 7/2014 | Chen | ............... | H01L 29/42356 |
| | | | | 438/157 |
| 2015/0024518 A1* | 1/2015 | Chang | ............... | H01L 22/20 |
| | | | | 438/14 |
| 2020/0135481 A1* | 4/2020 | Chen | ............... | H01L 21/823431 |
| 2022/0102202 A1* | 3/2022 | Hsiung | ............... | H01L 21/76832 |
| 2022/0319555 A1* | 10/2022 | Chen | ............... | H01L 21/76816 |

FOREIGN PATENT DOCUMENTS

| | | | | |
|---|---|---|---|---|
| CN | 109860050 A | | 6/2019 | |
| CN | 111463205 A | | 7/2020 | |
| CN | 111584488 A | | 8/2020 | |
| CN | 112563208 A | * | 3/2021 | ........... H10B 12/053 |

\* cited by examiner

METHOD FOR FABRICATING MEMORY AND MEMORY

CROSS-REFERENCE TO RELATED APPLICATION

This application is a continuation of PCT/CN2021/107453, filed on Jul. 20, 2021, which claims priority to Chinese Patent Application No. 202110408047.1 titled "METHOD FOR FABRICATING MEMORY AND MEMORY" and filed to the State Intellectual Property Office on Apr. 15, 2021, the entire contents of which are incorporated herein by reference.

TECHNICAL FIELD

The present disclosure relates to the field of storage device technologies, and more particularly, to a method for fabricating a memory and a memory.

BACKGROUND

As a semiconductor memory configured to randomly write and read data at high speed, Dynamic Random Access Memory (DRAM) is widely used in data storage devices or apparatuses. The DRAM generally includes transistors and capacitors. The capacitors are configured to store data information, and the transistors are configured to control read-write of the data information in the capacitors.

In the related technologies, the DRAM includes a substrate, wherein the substrate includes an active area, and the active area includes a first contact region and a second contact region. The substrate is provided with a plurality of bit lines arranged at intervals and an isolation layer covering the plurality of bit lines. The plurality of bit lines are electrically connected to the first contact region, a contact hole is formed on the isolation layer, and the contact hole extends to the substrate. The contact hole is filled with a lead, which is configured to electrically connect the capacitors and the second contact region. To increase a contact area between the lead and the second contact region, the substrate is generally etched along the contact hole to form a contact groove in the substrate. The contact hole and the contact groove form a filling hole, and the filling hole is filled with the lead.

However, in the process of forming the contact groove, the substrate is prone to overetching, which leads to larger voids in the subsequently formed leads and lower yield of the memory.

SUMMARY

In a first aspect, embodiments of the present disclosure provide a method for fabricating a memory. This method includes: providing a substrate, the substrate being internally provided with a plurality of active areas arranged at intervals, and each of the plurality of active areas comprising a first contact region and a second contact region; forming a plurality of bit lines arranged at intervals on the substrate, each of the plurality of bit lines being connected to at least one of the first contact regions; forming an isolation layer on each of the plurality of bit lines, the isolation layer covering each of the plurality of bit lines and the substrate, the isolation layer being further provided with a plurality of filling holes, and the plurality of filling holes corresponding to the plurality of second contact regions one to one; etching the isolation layer and the substrate along the plurality of filling holes, such that the plurality of filling holes extend into the substrate, and the plurality of filling holes expose the second contact region; forming a first protection layer on the second contact region exposed in the plurality of filling holes; etching the first protection layer positioned at hole bottoms of the plurality of filling holes and the substrate, until the hole bottoms of the plurality of filling holes are at a predetermined depth of the substrate; and removing the remaining first protection layer.

In a second aspect, the embodiments of the present disclosure also provide a memory, which is formed by means of the above method for fabricating a memory.

DETAILED DESCRIPTION

In the related technologies, when fabricating a memory, generally an isolation layer with an etching hole is first provided, wherein a hole bottom of the etching hole may be positioned in the isolation layer, and then the isolation layer and a substrate are etched along the etching hole to form a first preset contact hole, wherein the preset contact hole exposes a second contact region. Next, byproducts are removed, and a protective gas such as nitrogen gas is filled. Next, the substrate is etched along the first preset contact hole to form a second preset contact hole. The above-mentioned process of forming the second preset contact hole by the etching hole generally needs to be completed within 480 min.

After the second preset contact hole is formed, a critical dimension (CD) test is performed, and next a film thickness measurement is performed, etc. After a preliminary test is qualified, the substrate is isotropically etched along the first preset contact hole to form a contact hole, such that the contact hole exposes more second contact regions. The above-mentioned process of forming the contact hole from the second preset contact hole generally needs to be completed within 120 min.

Figure 1:
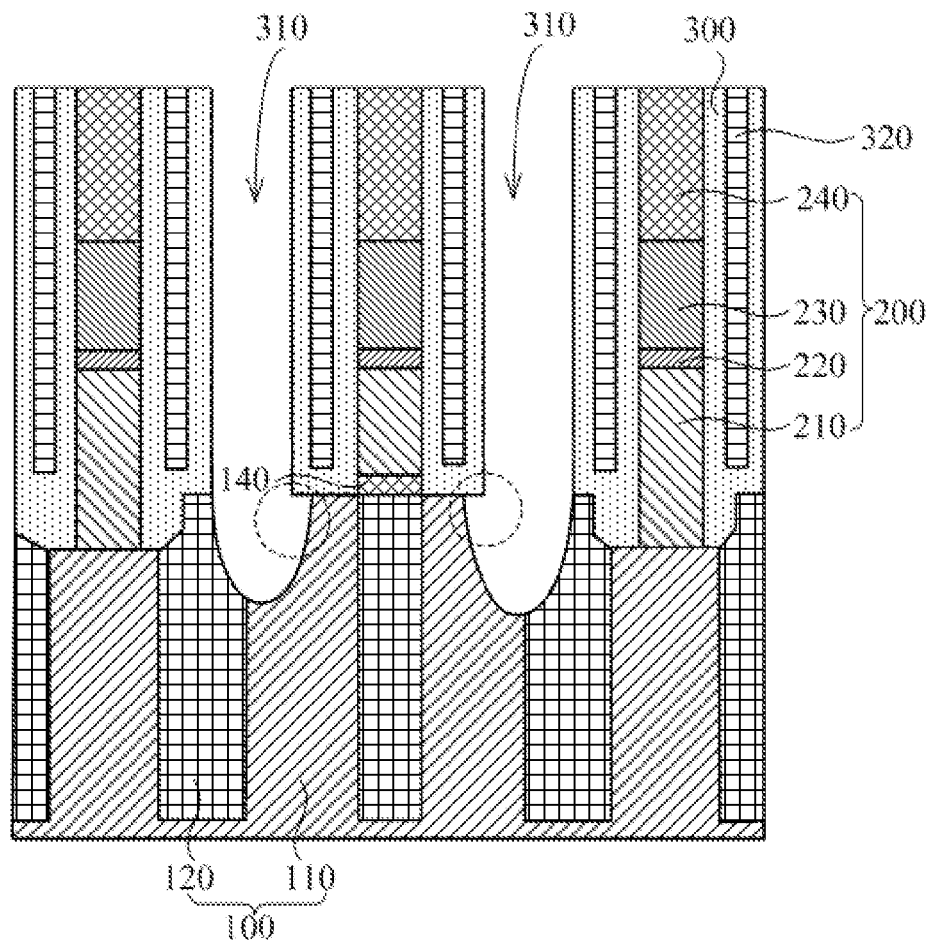
FIG. 1 is a schematic diagram of an overetched substrate in the prior art.

However, referring to FIG. 1, in the formed memory, an upper part of the isolation layer 300 is etched more, and the substrate 100 is prone to overetching, for example, regions as shown by dotted lines in FIG. 1, which leads to larger voids in subsequently formed leads and lower yield of the memory. In addition, the above processes of fabricating the memory generally need to be performed in different devices, which is prone to timeout, resulting in low yield of the memory.

To improve the yield of the memory, an embodiment of the present disclosure provides a method for fabricating a memory. The isolation layer and the substrate are etched along a filling hole of the isolation layer, such that the filling hole extends into the substrate. Next, a first protection layer is formed on the second contact region exposed in the filling hole. In the subsequent process of etching the first protection layer at a hole bottom of the filling hole and the substrate, the first protection layer can reduce or avoid the second contact region far from the hole bottom of the filling hole from being etched, such that overetching of the substrate is reduced. In this way, quality of the subsequently formed leads is improved, and the yield of the memory is increased.

To make the above objectives, features, and advantages of the embodiments of the present disclosure more apparent and lucid, the technical solutions in the embodiments of the present disclosure will be described clearly and completely below with reference to the accompanying drawings in the embodiments of the present disclosure. Apparently, the described embodiments are merely some but not all of the embodiments of the present disclosure. All other embodiments obtained by a person of ordinary skill in the art based on the embodiments of the present disclosure without creative efforts shall fall within the protection scope of the present disclosure.

Figure 2:
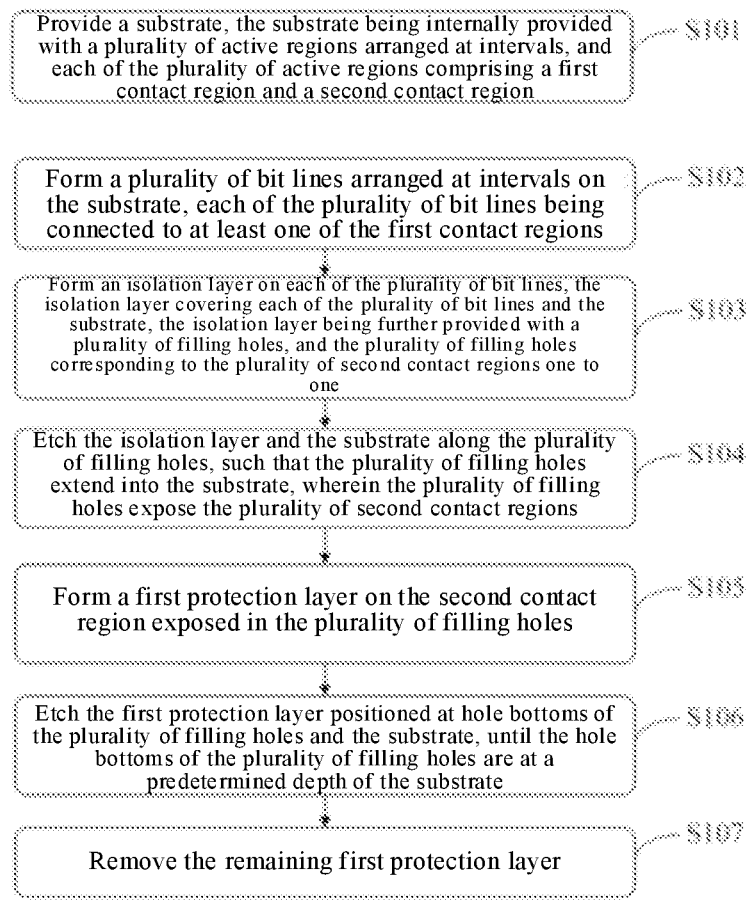
FIG. 2 is a flowchart of a method for fabricating a memory according to an embodiment of the present disclosure.

Referring to FIG. 2, an embodiment of the present disclosure provides a method for fabricating a memory, and this method includes following steps.

Step S101: providing a substrate, the substrate being internally provided with a plurality of active areas arranged at intervals, and each of the plurality of active areas comprising a first contact region and a second contact region.

Figure 3:
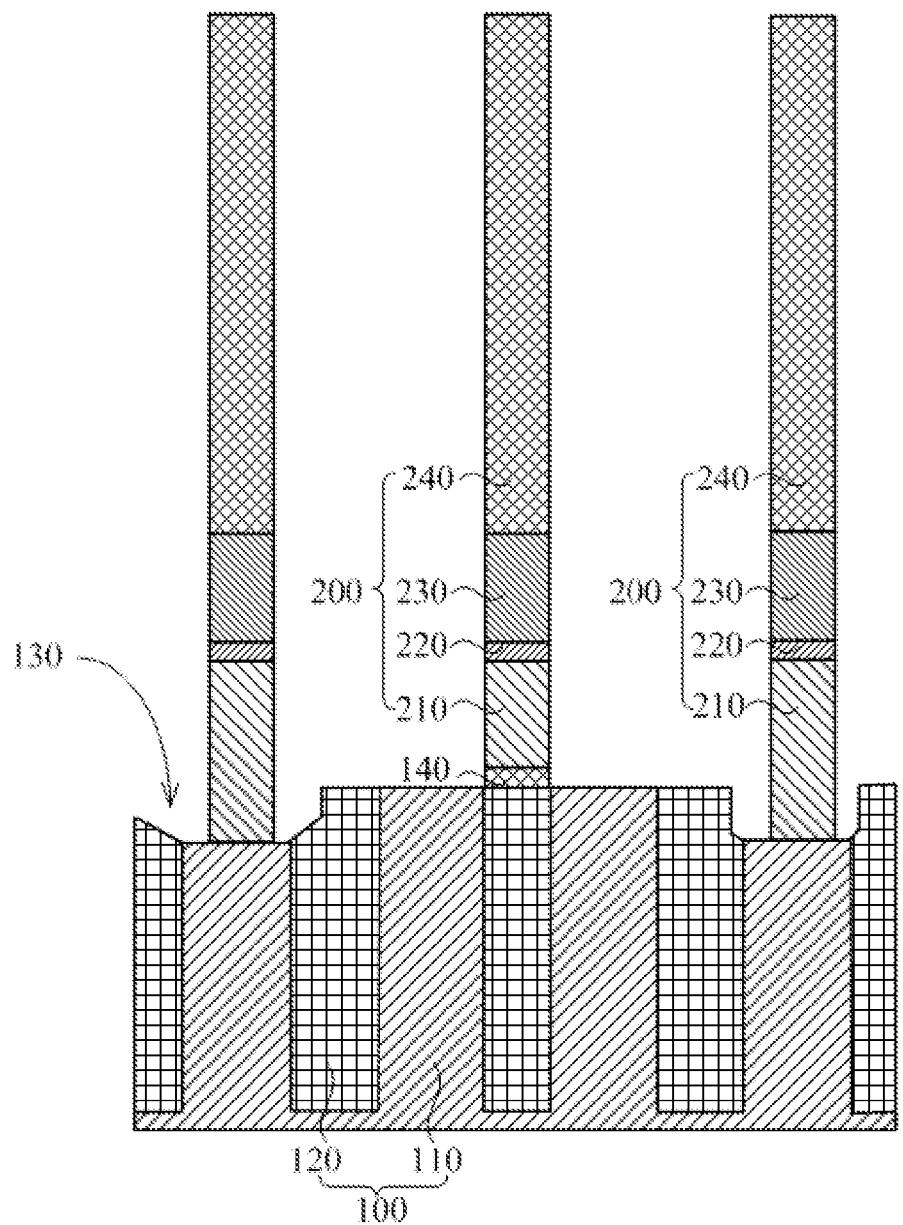
FIG. 3 is a schematic structural diagram obtained after a plurality of bit lines are formed according to an embodiment of the present disclosure.

Referring to FIG. 3, the substrate 100 is internally provided with a plurality of active areas 110, and the plurality of active areas 110 are arranged at intervals, e.g., the plurality of active areas 110 are arranged in an array. A shallow trench isolation (STI) structure 120 is arranged between the plurality of active areas 110, and the STI structure 120 may be filled with silicon oxide (for example, SiO2). The plurality of active areas 110 are isolated by the STI structure 120.

Each of the plurality of active areas 110 may include a first contact region and a second contact region, wherein the first contact region and the second contact region may be adjacent to each other. The first contact region is connected to a bit line 200, and the second contact region is connected to a capacitor, such that the plurality of bit lines 200 can read data information in the capacitor or write the data information into the capacitor.

In a possible example, the first contact region is positioned in a center of the active area 110, and the second contact region is positioned at two end of the active area 110. That is, two second contact regions are provided, and the two second contact regions are respectively positioned on two sides of the first contact region. A material of the active area 110 may include silicon (Si). Of course, the material of the active area 110 is not limited. For example, the material of the active area 110 may also be germanium (Ge), silicon on insulator (SOI), etc.

Step S102: forming a plurality of bit lines arranged at intervals on the substrate, each of the plurality of bit lines being connected to at least one of the first contact regions.

With continued reference to FIG. 3, a plurality of bit lines 200 are formed on the substrate 100, and the plurality of bit lines 200 are arranged at intervals, and each of the plurality of bit lines 200 is connected to at least one of the first contact regions. As shown in FIG. 3, the plurality of bit lines 200 are parallel to each other, and along an extension direction of the plurality of bit lines 200, the plurality of bit lines 200 are connected to a plurality of first contact regions positioned in this direction.

In a possible example, a bit line contact window 130 is formed on the substrate 100, and the plurality of bit lines 200 are connected to the first contact region by means of the bit line contact window 130. As shown in FIG. 3, a part of regions on an upper surface of the substrate 100 is recessed downward to form the bit line contact window 130. A part of regions of the plurality of bit lines 200 are positioned on the bit line contact window 130 to electrically connect the first contact region. A part of regions of the plurality of bit lines 200 are positioned on the upper surface of the substrate 100, and an insulating layer 140 such as a first silicon nitride layer may be provided between this part of regions and the substrate 100.

The plurality of bit lines 200 may include a first conductive layer 210, a second conductive layer 220, a third conductive layer 230, and a third protection layer 240 that are sequentially stacked. The first conductive layer 210 is arranged on the substrate 100. That is, the third protection layer 240 is away from the substrate 100.

Exemplarily, the first conductive layer 210 may be a polycrystalline silicon layer, the second conductive layer 220 may be a titanium nitride (TiN) layer, the third conductive layer 230 may be a tungsten (W) layer, and the third protection layer 240 may be a second silicon nitride layer.

Step S103: forming an isolation layer on each of the plurality of bit lines, the isolation layer covering each of the plurality of bit lines and the substrate, the isolation layer being further provided with a plurality of filling holes, and the plurality of filling holes corresponding to the plurality of second contact regions one to one.

Figure 4:
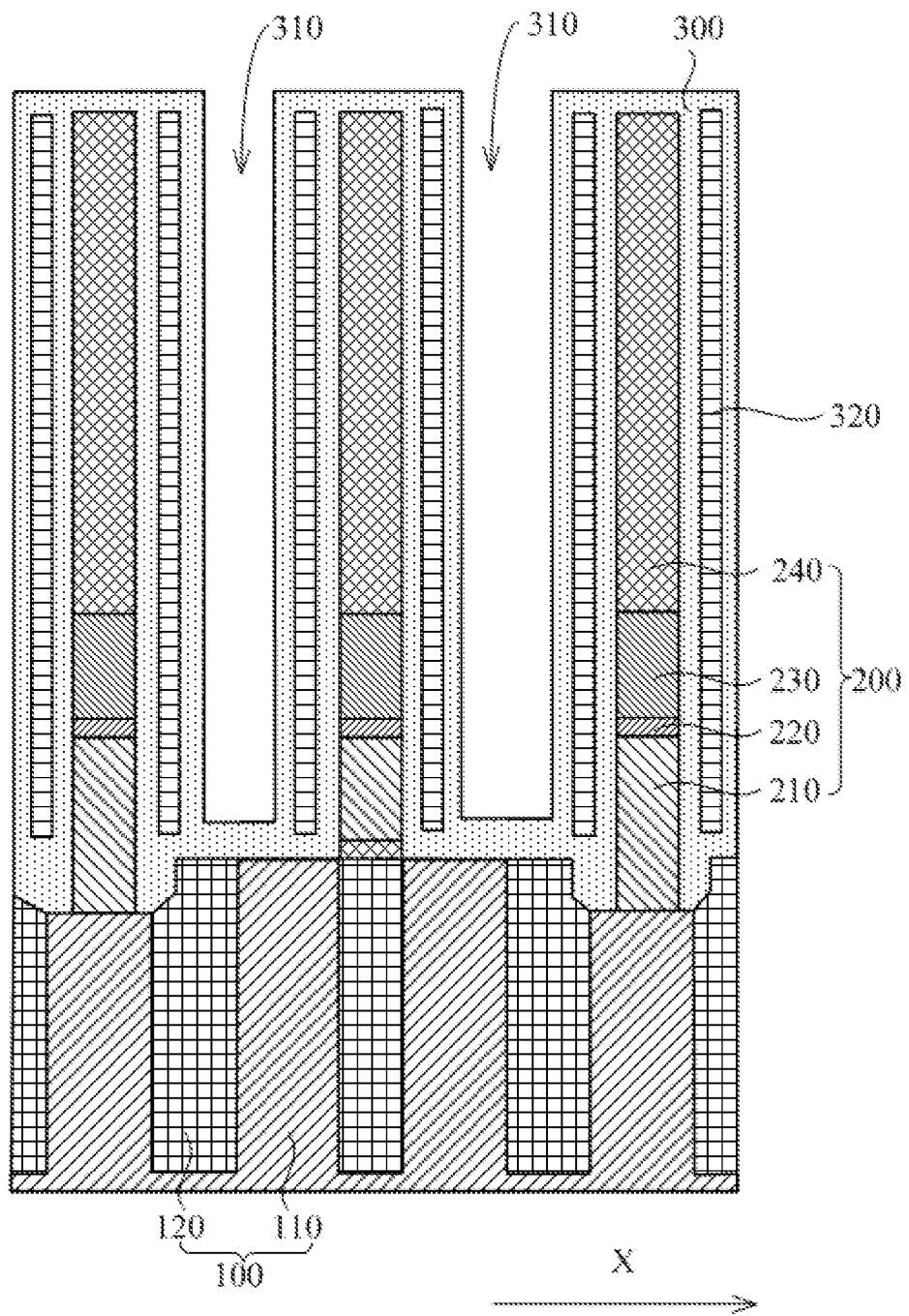
FIG. 4 is a schematic structural diagram obtained after an isolation layer is formed according to an embodiment of the present disclosure.

Referring to FIG. 4, the isolation layer 300 is formed on each of the plurality of bit lines 200 and the substrate 100. As shown in FIG. 4, the isolation layer 300 is formed on a side surface and an upper surface of each of the plurality of bit lines 200 and the upper surface of the substrate 100. The isolation layer 300 may be formed by a deposition process such as a chemical vapor deposition (CVD), a physical vapor deposition (PVD) or an atomic layer deposition (ALD).

A plurality of filling holes 310 are formed in the isolation layer 300, and the plurality of filling holes 310 correspond to the plurality of second contact regions one to one. Exemplarily, the plurality of filling holes 310 may be arranged in a square array in the isolation layer 300, and an orthographic projection of each of the plurality of filling holes 310 on the substrate 100 covers at least a part of the second contact regions. Referring to FIG. 4, a hole wall and a hole bottom of each of the plurality of filling holes 310 are both the isolation layer 300.

As shown in FIG. 4, a plurality of oxide layers 320 may also be provided in the isolation layer 300, and an extension direction of the plurality of oxide layers 320 is the same as that of the plurality of bit lines 200. One of the plurality of oxide layers 320 is respectively provided on two sides of each of the plurality of bit lines 200. It is to be understood that along a direction from the plurality of bit lines 200 to the plurality of filling holes 310, i.e., the X direction as shown in FIG. 4, nitride layer-oxide layer-nitride layer are provided in sequence outside each of the plurality of bit lines 200, that is, a Nitride-Oxide-Nitride (NON) structure is formed.

Step S104: etching the isolation layer and the substrate along the plurality of filling holes, such that the plurality of filling holes extend into the substrate, wherein the plurality of filling holes expose the plurality of second contact regions.

Figure 5:
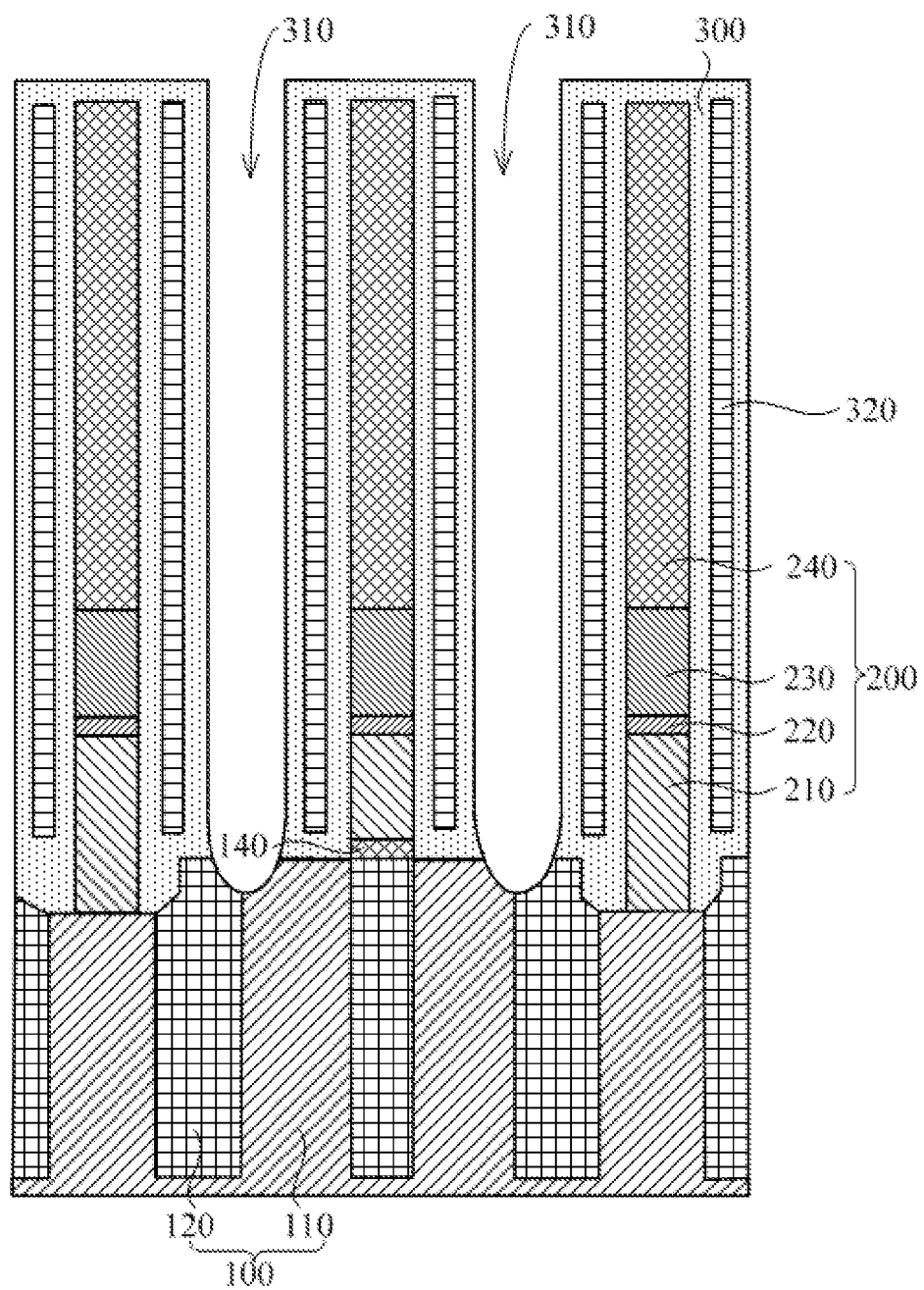
FIG. 5 is a schematic structural diagram obtained after the isolation layer and the substrate are etched along a filling hole according to an embodiment of the present disclosure.

Referring to FIG. 5, a hole bottom of each of the plurality of filling holes 310 is etched along each of the plurality of filling holes 310, such that the hole bottom of each of the plurality of filling holes 310 is positioned in the substrate 100, and the plurality of filling holes 310 expose the plurality of second contact regions. The hole bottom and the hole wall of each of the plurality of filling holes 310 formed after the etching are in smooth transition. That is, the hole bottom of each of the plurality of filling holes 310 is arc-shaped, to facilitate the subsequent steps. As shown in FIG. 5, the hole bottom of each of the plurality of filling holes 310 is positioned in the substrate 100.

During the etching, directional etching may be employed. For example, based on control of plasma directionality, the isolation layer 300 and the substrate 100 are etched along the desired direction to expose the plurality of second contact regions. It is to be understood that the etching is performed along a vertical direction as shown in FIG. 5 to reduce the etching along a horizontal direction, that is, to reduce lateral etching.

Exemplarily, the processes of etching the isolation layer 300 and the substrate 100 may be performed in an etching machine. A first etching gas may comprise carbon tetrafluoride ($CF_4$), trifluoromethane ($CHF_3$), chlorine ($Cl_2$), oxygen ($O_2$), and argon (Ar). A first radio frequency power is 500 W to 1,500 W, a first radio frequency voltage is 50 V to 500 V, and a first pressure is 4 mT to 30 mT.

Step S105: forming a first protection layer on the second contact region exposed in the plurality of filling holes.

Figure 6:
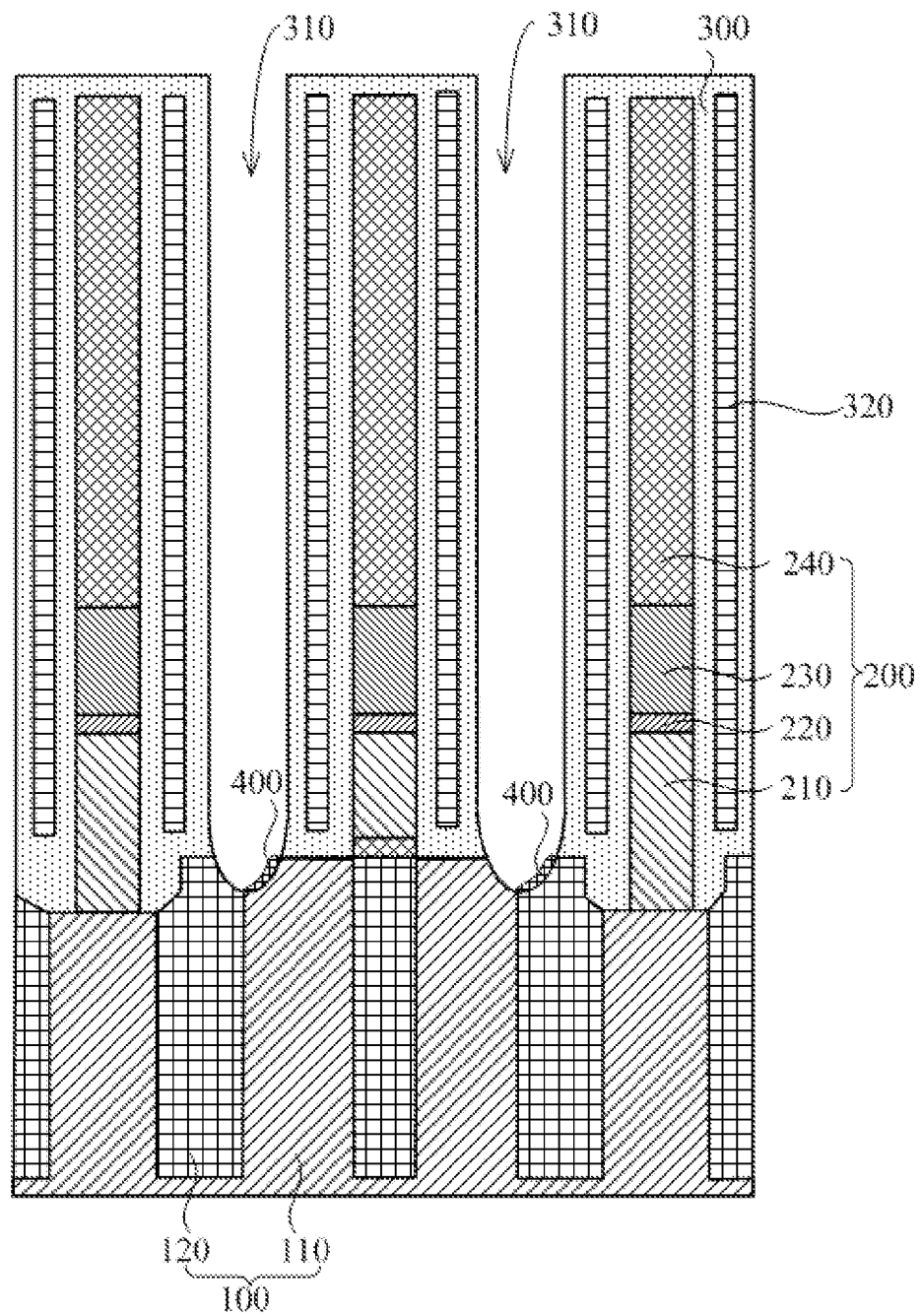
FIG. 6 is a schematic structural diagram obtained after a first protection layer is formed according to an embodiment of the present disclosure.

Referring to FIG. 6, a first protection layer 400 is formed on the exposed second contact region, wherein a material of the first protection layer 400 may be silicon oxide. The first protection layer 400 isolates and protects the second contact region, such that during the subsequent etching, an etching liquid or etching gas does not directly contact the second contact region, thereby reducing the etching of the second contact region, especially the etching of upper sidewalls of the second contact region. In this way, lateral overetching of the second contact region can be reduced or avoided.

The process of forming the first protection layer 400 may be performed in the etching machine. Exemplarily, the first protection layer 400 is formed on the second contact region exposed in each of the plurality of filling holes 310 by means of an in-situ oxidation process. Oxidizing gases include oxygen, argon and nitrogen ($N_2$), a second radio frequency power is 300 W to 2,000 W, and a second pressure is 10 mT to 100 mT.

Step S106: etching the first protection layer positioned at hole bottoms of the plurality of filling holes and the substrate, until the hole bottoms of the plurality of filling holes are at a predetermined depth of the substrate.

Figure 7:
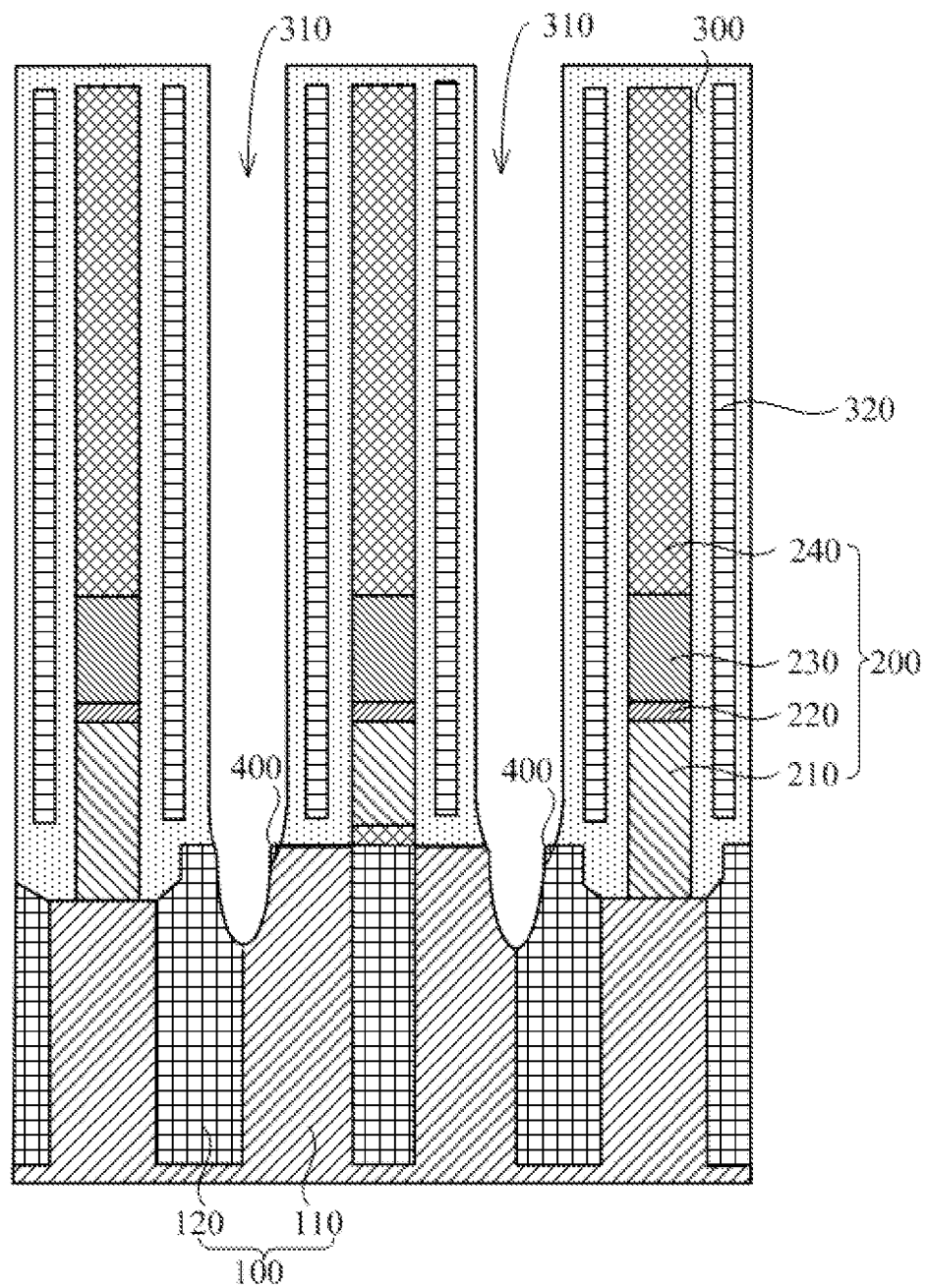
FIG. 7 is a schematic structural diagram obtained after the first protection layer at a hole bottom of the filling hole and the substrate are etched according to an embodiment of the present disclosure.

Referring to FIG. 7, the hole bottoms of the plurality of filling holes 310 are etched along the plurality of filling holes 310, such that the bottoms of the plurality of filling holes 310 are at a predetermined depth of the substrate 100. By means of the etching, an area of exposure of the second contact region may be increased, such that an area of contact between the second contact region and the subsequently formed leads may be increased, a resistance of contact between the second contact region and the leads may be reduced, and storage speed and storage efficiency of the memory may be improved.

As shown in FIG. 7, when the plurality of filling holes 310 are etched, a part of the first protection layer 400 close to the hole bottom are removed, and a part of the first protection layer 400 far from the hole bottom are remained. That is, a part of the first protection layer 400 is still remained on a part of the second contact region on the upper surface of the substrate 100, which reduces the lateral etching of a part of the second contact region and avoids the overetching of the second contact region.

The processes of etching the first protection layer 400 positioned at the hole bottom of each of the plurality of filling holes 310 and the substrate 100 may be performed in the etching machine. Exemplarily, the first protection layer 400 positioned at the hole bottom of each of the plurality of filling holes 310 and the substrate 100 are dry-etched. A second etching gas comprises carbon tetrafluoride ($CF_4$) and chlorine ($Cl_2$), etc.

Step S107: removing the remaining first protection layer.

Figure 8:
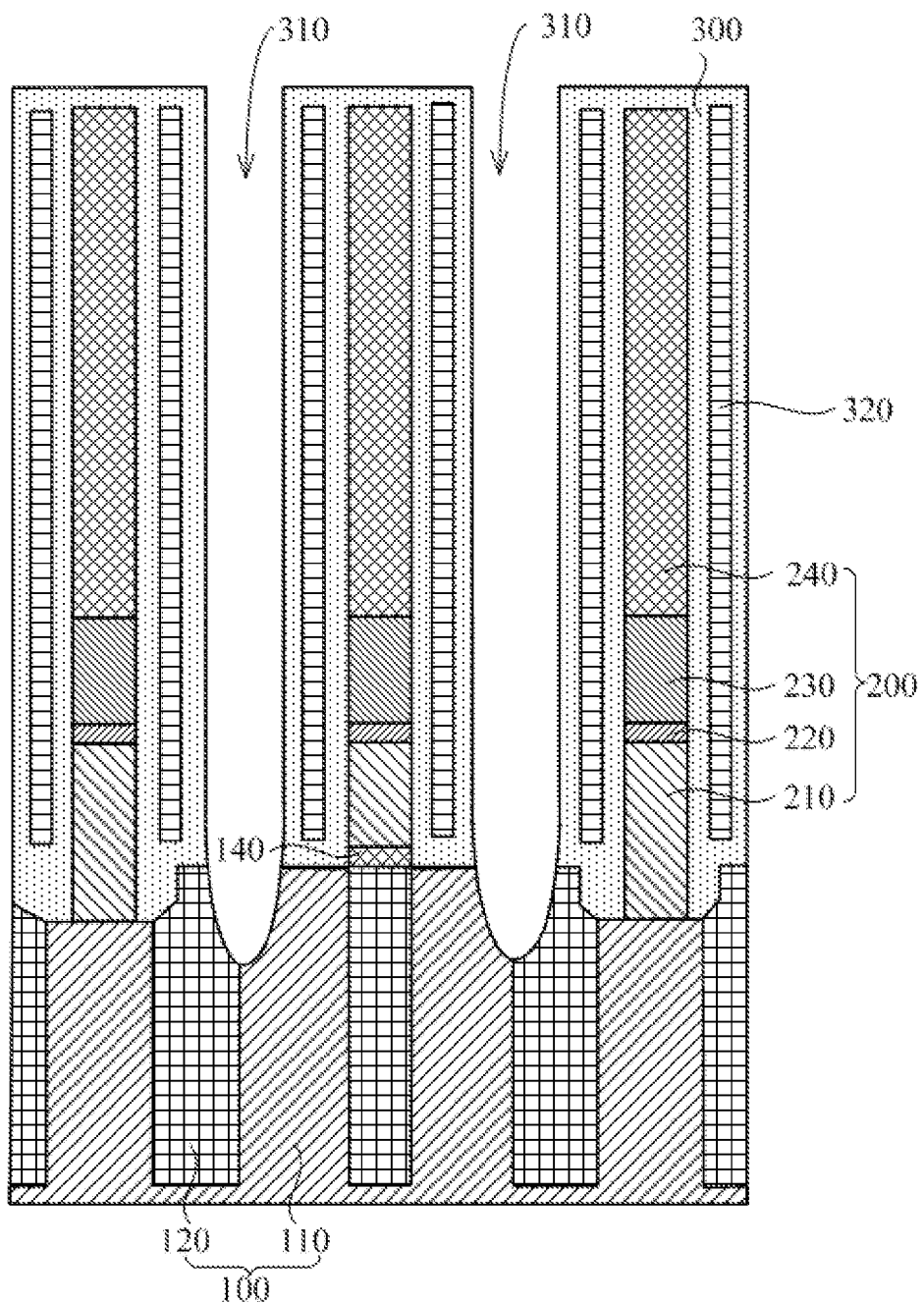
FIG. 8 is a schematic structural diagram obtained after the remaining first protection layer is removed according to an embodiment of the present disclosure.

Referring to FIG. 8, the first protection layer 400 is removed to expose the second contact region and increase the area of exposure of the second contact region. It is to be understood that when removing the remaining first protection layer 400, the bottom of each of the plurality of filling holes 310 may be modified by means of stronger lateral etching, such that each of the plurality of filling holes 310 positioned in the substrate 100 forms a relatively smooth arc. In addition, a surface area of the second contact region exposed in each of the plurality of filling holes 310 may be further increased.

The process of removing the remaining first protection layer 400 may be performed in the etching machine. Exemplarily, the remaining first protection layer 400 is dry-etched, and a third etching gas includes sulfur hexafluoride ($SF_6$), argon, oxygen, and carbon tetrafluoride ($CF_4$), etc.

It is to be noted that etching the isolation layer 300 and the substrate 100 along each of the plurality of filling holes 310, forming the first protection layer 400 on the second contact region exposed in each of the plurality of filling holes 310, etching the first protection layer 400 positioned at the hole bottom of each of the plurality of filling holes 310 and the substrate 100, and removing the remaining first protection layer 400 may be performed in the same etching machine. That is, Steps S104 to S107 may be performed in the same etching machine, which reduces waiting time in different devices, avoids process timeout, and further improves the yield of the memory.

The method for fabricating a memory in the embodiments of the present disclosure includes: providing a substrate 100, wherein the substrate 100 is internally provided with a plurality of active areas 110 arranged at intervals, and each of the plurality of active areas 110 comprises a first contact region and a second contact region; forming a plurality of bit lines 200 arranged at intervals on the substrate 100, each of the plurality of bit lines 200 is connected to at least one of the first contact regions; forming an isolation layer 300 on each of the plurality of bit lines 200, wherein the isolation layer 300 covers each of the plurality of bit lines 200 and the substrate 100, the isolation layer 300 is further provided with a plurality of filling holes 310, and the plurality of filling holes 310 correspond to the plurality of second contact regions one to one; etching the isolation layer 300 and the substrate 100 along the plurality of filling holes 310, such that the plurality of filling holes 310 extend into the substrate 100, and the plurality of filling holes 310 expose the second contact region; forming a first protection layer 400 on the second contact region exposed in the plurality of filling holes 310; etching the first protection layer 400 positioned at hole bottoms of the plurality of filling holes 310 and the substrate 100, until the hole bottoms of the plurality of filling holes 310 are at a predetermined depth of the substrate 100; and removing the remaining first protection layer 400. By forming the first protection layer 400 on the second contact region exposed in each of the plurality of filling holes 310, the first protection layer 400 can reduce or prevent the second contact region far from the hole bottom of each of the plurality of filling holes 310 from being etched in the process of subsequently etching the first protection layer 400 positioned at the hole bottoms of the plurality of filling holes 310 and the substrate 100, such that overetching of the substrate 100 can be reduced. In this way, quality of the subsequently formed leads can be improved, and thus the yield of the memory can be improved.

Figure 9:
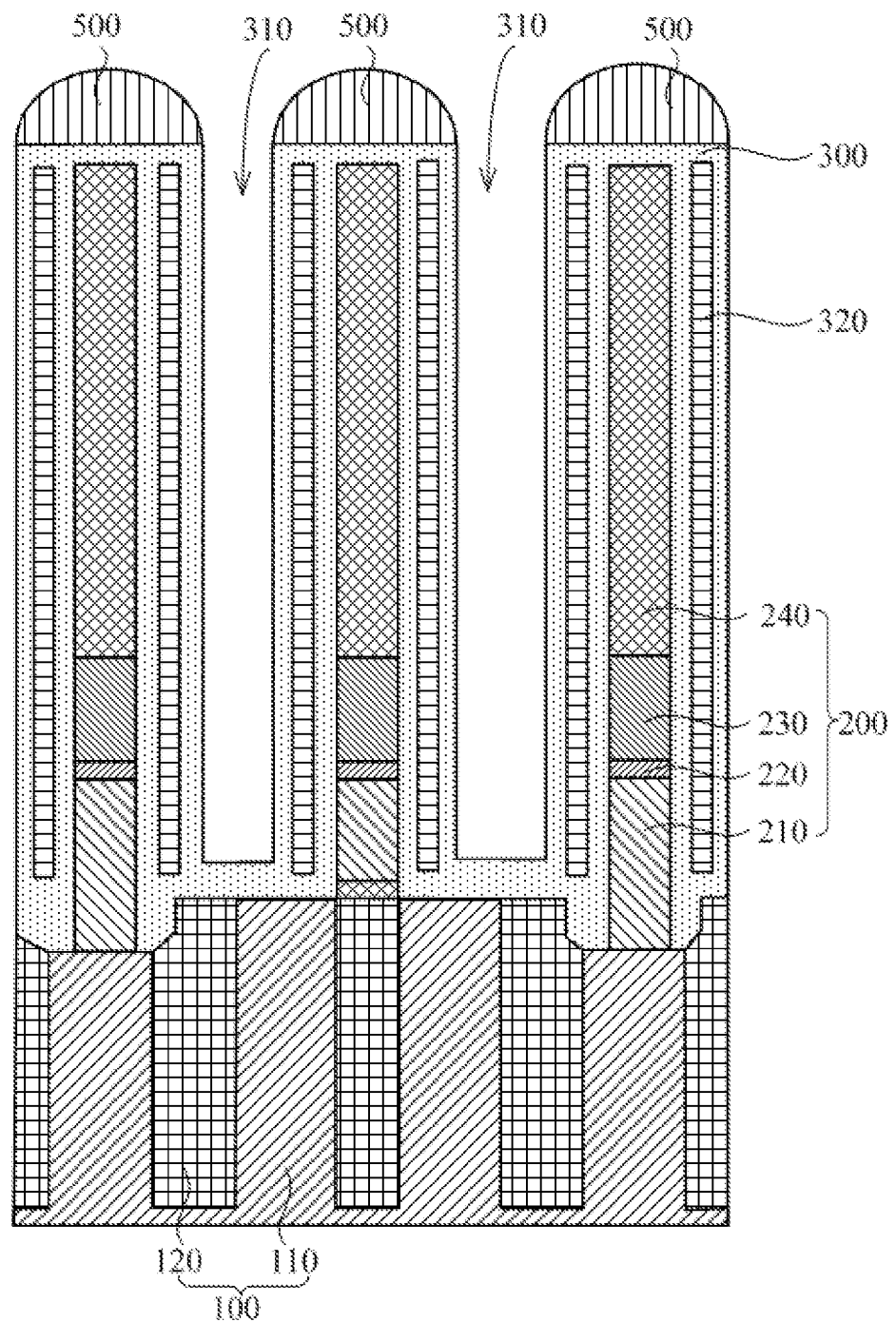
FIG. 9 is a schematic structural diagram obtained after a second protection layer is formed according to an embodiment of the present disclosure.
Figure 10:
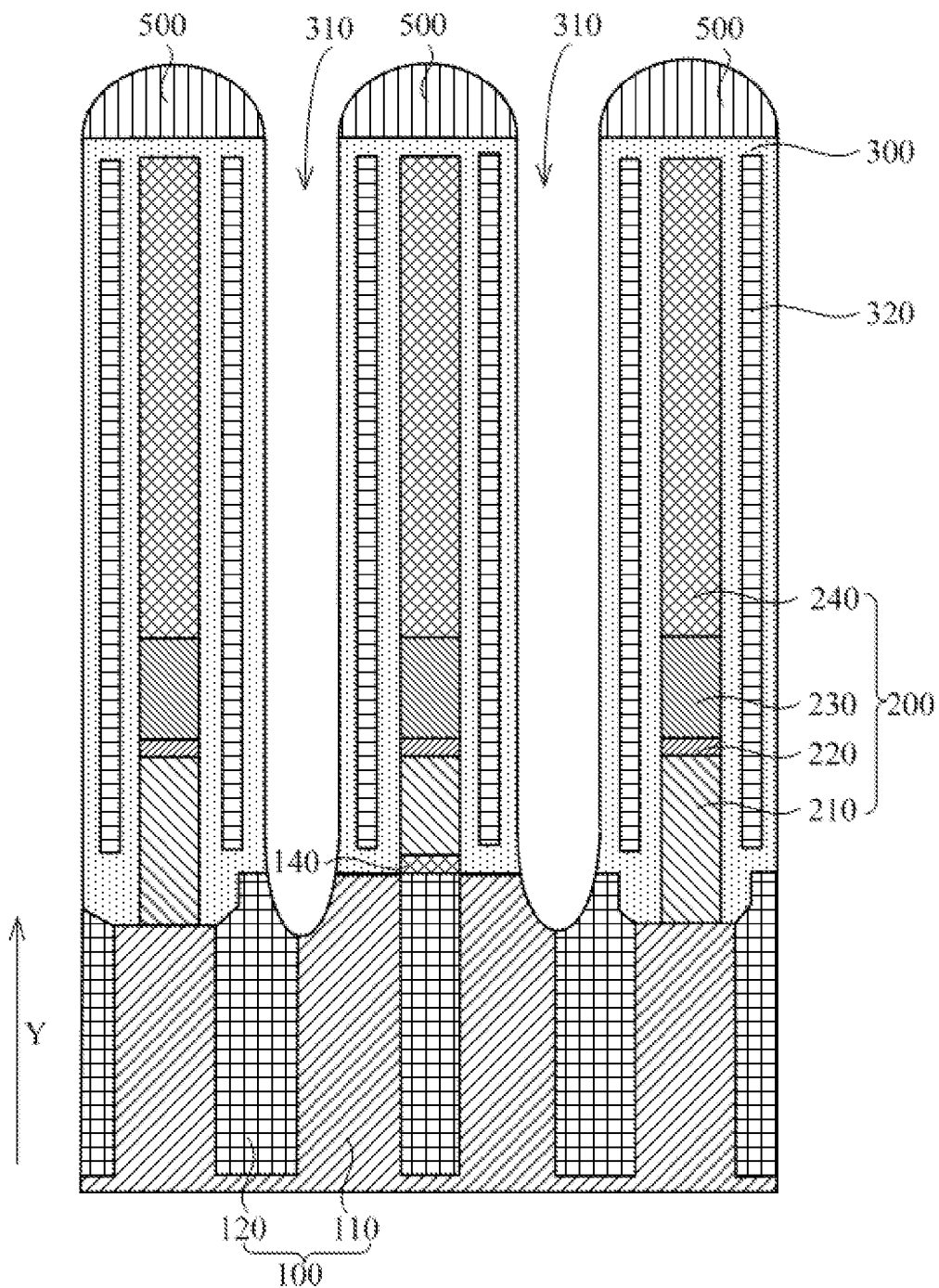
FIG. 10 is a schematic structural diagram obtained after etching the first protection layer at the hole bottom of the filling hole and the substrate after the second protection layer is formed according to an embodiment of the present disclosure.

It is to be noted that referring to FIG. 9 and FIG. 10, before etching the isolation layer 300 and the substrate 100 along the plurality of filling holes 310, such that the plurality of filling holes 310 extend into the substrate 100, and the plurality of filling holes 310 expose the second contact region, the method for fabricating a memory may further comprise: forming a second protection layer 500 on a surface of the isolation layer 300 facing away from the substrate 100.

As shown in FIG. 9 and FIG. 10, the second protection layer 500 is formed on the upper surface of the isolation layer 300. When the isolation layer 300 and the substrate 100 are etched along the plurality of filling holes 310, the second protection layer 500 protects the isolation layer 300, thereby reducing or preventing the isolation layer 300 from being etched, such that a height of the isolation layer 300 along the vertical direction (the Y direction as shown in FIG. 10) is unchanged or is less reduced. In this way, stability of an etching window is increased, and it is avoided the exposure of a third conductive layer 230 of each of the plurality of bit lines 200 due to etching the isolation layer 300 and the third protection layer 240. In addition, providing the second protection layer 500 can also make the upper surface of the isolation layer 300 relatively smooth.

The process of forming the second protection layer 500 may be performed in the etching machine. Exemplarily, the second protection layer 500 may be a carbon (C) layer, and the second protection layer 500 may be formed on the surface of the isolation layer 300 facing away from the substrate 100 by means of an in-situ deposition process. A reaction gas includes carbon tetrafluoride and helium (He), a third radio frequency power is 200 W to 1,800 W, a second radio frequency voltage is 0 V, and a third pressure is 5 mT to 100 mT.

Forming the second protection layer 500, etching the isolation layer 300 and the substrate 100 along each of the plurality of filling holes 310, forming the first protection layer 400 on the second contact region exposed in each of the plurality of filling holes 310, etching the first protection layer 400 positioned at the hole bottom of each of the plurality of filling holes 310 and the substrate 100, and removing the remaining first protection layer 400 may be performed in the same etching machine, which further reduces the waiting time in different devices and avoids process timeout.

As shown in FIG. 9 and FIG. 10, after the second protection layer 500 is formed, the second protection layer 500 is positioned on the upper surface of the isolation layer 300, and there is fewer or even no second protection layer 500 on the hole walls and hole bottoms of the plurality of filling holes 310. In this way, difficulty in subsequently etching the hole bottoms of the plurality of filling holes 310 is reduced.

Figure 11:
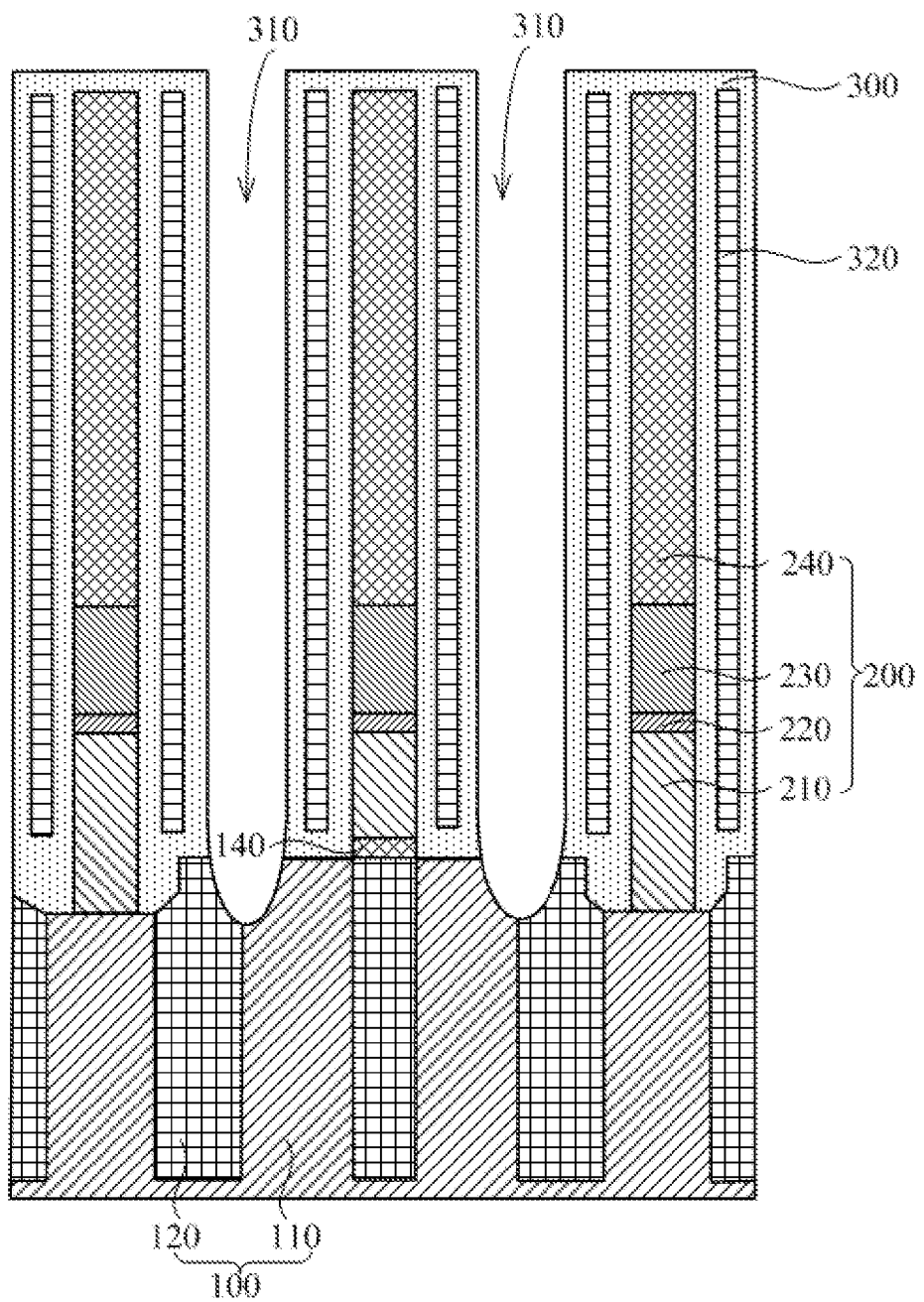
FIG. 11 is a schematic structural diagram of obtained after the second protection layer is removed according to an embodiment of the present disclosure.

It is to be noted that referring to FIG. 11, before forming the first protection layer 400 on the second contact region exposed in the plurality of filling holes 310, the method for fabricating a memory may further comprise: removing the second protection layer 500 to expose the isolation layer 300. As shown in FIG. 11, before the first protection layer 400 is formed, the second protection layer 500 is removed to expose the surface of the isolation layer 300 away from the substrate 100.

An embodiment of the present disclosure also provides a memory. As shown in FIG. 11, the memory is formed by means of the above-mentioned method for fabricating a memory, and thus the substrate 100 has less overetching or even no overetching and has fewer voids in the leads, such that the yield of the memory is improved. Reference is made to the above description for the effects, which are not repeated any more herein.

The embodiments or the implementations in the specification are described in a progressive manner. Each of the embodiments is focused on difference from other embodiments, and cross reference is available for identical or similar parts among different embodiments.

In the descriptions of this specification, descriptions of reference terms "one embodiment", "some embodiments", "an exemplary embodiment", "an example", "one example", or "some examples" are intended to indicate that features, structures, materials, or characteristics described with reference to the embodiment or example are included in at least one embodiment or example of this present disclosure. The schematic representation of the above terms throughout this specification does not necessarily refer to the same embodiment or example. Furthermore, the features, structures, materials, or characteristics set forth may be combined in any suitable manner in one or more embodiments or examples.

Finally, it should be noted that the foregoing embodiments are merely intended for describing the technical solutions of the present disclosure, but not for limiting the present disclosure. Although the present disclosure is described in detail with reference to the foregoing embodiments, persons of ordinary skill in the art should understand that they may still make modifications to the technical solutions described in the foregoing embodiments or make equivalent replacements to some or all technical features thereof, which does not make corresponding technical solutions in essence depart from the scope of the technical solutions of the embodiments of the present disclosure.

What is claimed is:

1. Method for fabricating a memory, comprising:
providing a substrate, the substrate being internally provided with a plurality of active areas arranged at intervals, and each of the plurality of active areas comprising a first contact region and a second contact region;

forming a plurality of bit lines arranged at intervals on the substrate, each of the plurality of bit lines being connected to at least one of the first contact regions;

forming an isolation layer on each of the plurality of bit lines, the isolation layer covering each of the plurality of bit lines and the substrate, the isolation layer being further provided with a plurality of filling holes, and the plurality of filling holes corresponding to a plurality of second contact regions one to one;

etching the isolation layer and the substrate along the plurality of filling holes, such that the plurality of filling holes extend into the substrate, and the plurality of filling holes expose the plurality of second contact regions;

forming a first protection layer on the plurality of second contact regions exposed in the plurality of filling holes;

etching the first protection layer positioned at hole bottoms of the plurality of filling holes and the substrate, until the hole bottoms of the plurality of filling holes are at a predetermined depth of the substrate; and removing the remaining first protection layer; and, wherein the first protection layer is formed on the plurality of second contact regions exposed in the plurality of filling holes by means of an in-situ oxidation process using an oxidizing gas.

2. The method for fabricating a memory according to claim 1, wherein etching the isolation layer and the substrate along the plurality of filling holes, forming a first protection layer on the plurality of second contact regions exposed in the plurality of filling holes, etching the first protection layer positioned at the hole bottoms of the plurality of filling holes and the substrate, and removing the remaining first protection layer are performed in a same etching machine.

3. The method for fabricating a memory according to claim 1, wherein etching the isolation layer and the substrate along the plurality of filling holes using a first etching gas, the first etching gas comprises carbon tetrafluoride ($CF_4$), trifluoromethane ($CHF_3$), chlorine ($Cl_2$), oxygen ($O_2$), and argon (Ar).

4. The method for fabricating a memory according to claim 3, wherein when etching the isolation layer and the substrate along the plurality of filling holes, a first radio frequency power is 500 W to 1,500 W, a first radio frequency voltage being 50 V to 500 V, and a first pressure being 4 mT to 30 mT.

5. The method for fabricating a memory according to claim 1, wherein the oxidizing gas comprises oxygen ($O_2$), argon (Ar), and nitrogen ($N_2$).

6. The method for fabricating a memory according to claim 1, wherein in the in-situ oxidation process, a second radio frequency power is 300 W to 2,000 W, and a second pressure being 10 mT to 100 mT.

7. The method for fabricating a memory according to claim 1, wherein etching the first protection layer positioned at the hole bottoms of the plurality of filling holes and the substrate using a second etching gas, the second etching gas comprises carbon tetrafluoride ($CF_4$) and chlorine ($Cl_2$).

8. The method for fabricating a memory according to claim 1, wherein removing the remaining first protection layer using a third etching gas, the third etching gas comprises sulfur hexafluoride ($SF_6$), argon (Ar), oxygen ($O_2$), and carbon tetrafluoride ($CF_4$).

9. The method for fabricating a memory according to claim 1, wherein in steps of etching the isolation layer and the substrate along the plurality of filling holes, such that the plurality of filling holes extend into the substrate, and the plurality of filling holes expose the plurality of second contact regions, hole bottoms and hole walls of the plurality of filling holes are in circular arc transition.

10. The method for fabricating a memory according to claim 1, wherein before etching the isolation layer and the substrate along the plurality of filling holes, such that the plurality of filling holes extend into the substrate, and the plurality of filling holes expose the plurality of second contact regions, the method further comprises:

forming a second protection layer on a surface of the isolation layer facing away from the substrate.

11. The method for fabricating a memory according to claim 10, wherein the second protection layer is a carbon layer, the second protection layer being formed by means of an in-situ deposition process.

12. The method for fabricating a memory according to claim 11, wherein in the in-situ deposition process, reaction gases comprise carbon tetrafluoride ($CF_4$) and helium (He).

13. The method for fabricating a memory according to claim 11, wherein in the in-situ deposition process, a third radio frequency power is 200 W to 1,800 W, a second radio frequency voltage being 0V, and a third pressure being 5 mT to 100 mT.

14. The method for fabricating a memory according to claim 10, wherein before forming a first protection layer on the plurality of second contact regions exposed in the plurality of filling holes, the method further comprises:

removing the second protection layer to expose the isolation layer.

15. A memory formed by following method:

providing a substrate, the substrate being internally provided with a plurality of active areas arranged at intervals, and each of the plurality of active areas comprising a first contact region and a second contact region;

forming a plurality of bit lines arranged at intervals on the substrate, each of the plurality of bit lines being connected to at least one of the first contact regions;

forming an isolation layer on each of the plurality of bit lines, the isolation layer covering each of the plurality of bit lines and the substrate, the isolation layer being further provided with a plurality of filling holes, and the plurality of filling holes corresponding to a plurality of second contact regions one to one;

etching the isolation layer and the substrate along the plurality of filling holes, such that the plurality of filling holes extend into the substrate, and the plurality of filling holes expose the plurality of second contact regions;

forming a first protection layer on the plurality of second contact regions exposed in the plurality of filling holes;

etching the first protection layer positioned at hole bottoms of the plurality of filling holes and the substrate, until the hole bottoms of the plurality of filling holes are at a predetermined depth of the substrate; and removing the remaining first protection layer; and, wherein the first protection layer is formed on the plurality of second contact regions exposed in the plurality of filling holes by means of an in-situ oxidation process using an oxidizing gas.

* * * * *